United States Patent
Petranovic et al.

(10) Patent No.: US 6,532,585 B1
(45) Date of Patent: Mar. 11, 2003

(54) METHOD AND APPARATUS FOR APPLICATION OF PROXIMITY CORRECTION WITH RELATIVE SEGMENTATION

(75) Inventors: Dusan Petranovic, Cupertino, CA (US); Ranko Scepanovic, San Jose, CA (US); Edwin Jones, Los Altos, CA (US); Richard Schinella, Saritoga, CA (US); Nicholas F. Pasch, Pacifica, CA (US); Mario Garza, Sunnyvale, CA (US); Keith K. Chao, San Jose, CA (US); John V. Jensen, Fremont, CA (US); Nicholas K. Eib, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 176 days.

(21) Appl. No.: 09/714,370

(22) Filed: Nov. 14, 2000

Related U.S. Application Data

(62) Division of application No. 09/034,550, filed on Mar. 3, 1998, now Pat. No. 6,174,630.

(51) Int. Cl.⁷ ............................................. G06F 17/50
(52) U.S. Cl. ....................................................... 716/19
(58) Field of Search .................. 716/19, 20, 21, 716/5

(56) References Cited

U.S. PATENT DOCUMENTS

| | | |
|---|---|---|
| 5,432,714 A | 7/1995 | Chung et al. |
| 5,682,323 A | 10/1997 | Pasch et al. |
| 5,698,859 A * | 12/1997 | Haruki .................. 716/21 |
| 5,705,301 A | 1/1998 | Garza et al. |
| 5,723,233 A | 3/1998 | Garza et al. |
| 5,792,581 A | 8/1998 | Ohnuma |
| 5,804,340 A | 9/1998 | Garza et al. |
| 5,885,748 A | 3/1999 | Ohnuma |
| 5,894,057 A | 4/1999 | Yamaguchi et al. |
| 5,900,338 A | 5/1999 | Garza et al. |
| 6,078,738 A | 6/2000 | Garza et al. |

* cited by examiner

*Primary Examiner*—Matthew Smith
*Assistant Examiner*—Thuan Do
(74) *Attorney, Agent, or Firm*—Conley, Rose & Tayon

(57) ABSTRACT

The present invention is a method and apparatus for applying one-dimensional proximity correction to a piece of a mask pattern, by segmenting a first piece of a mask pattern with horizontal dividing lines into a plurality of segments, segmenting a second piece of said mask pattern with said horizontal dividing lines into a second plurality of segments, and applying proximity correction to a first segment from said first plurality of segments taking into consideration a second segment from said second plurality of segments.

35 Claims, 19 Drawing Sheets

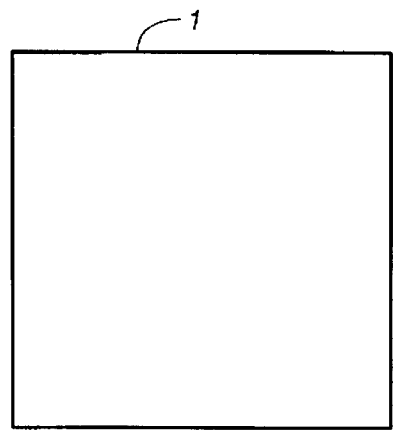
FIG._1A
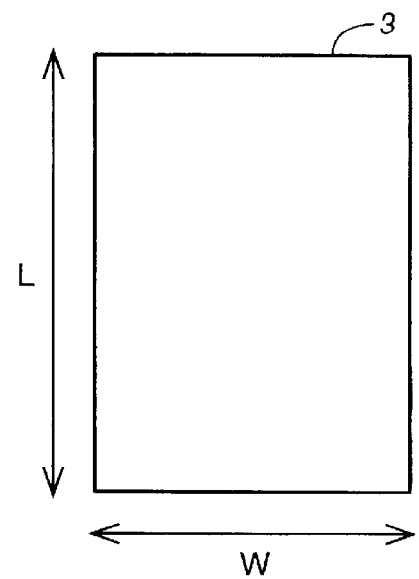
FIG._2A
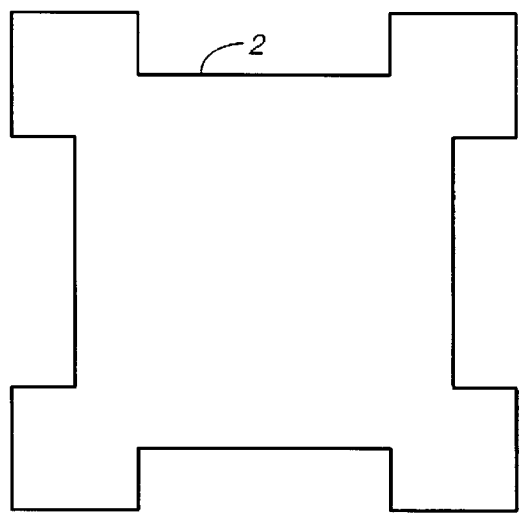
FIG._1B
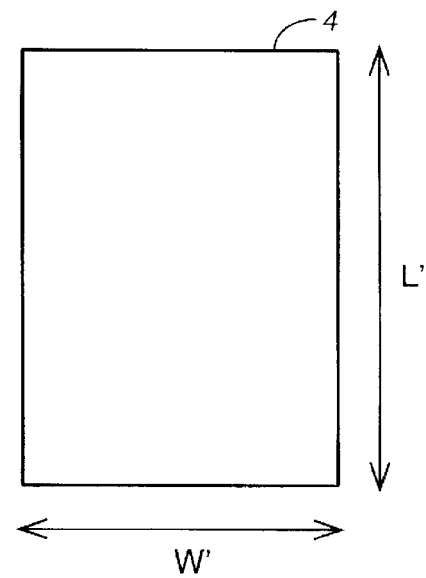
FIG._2B

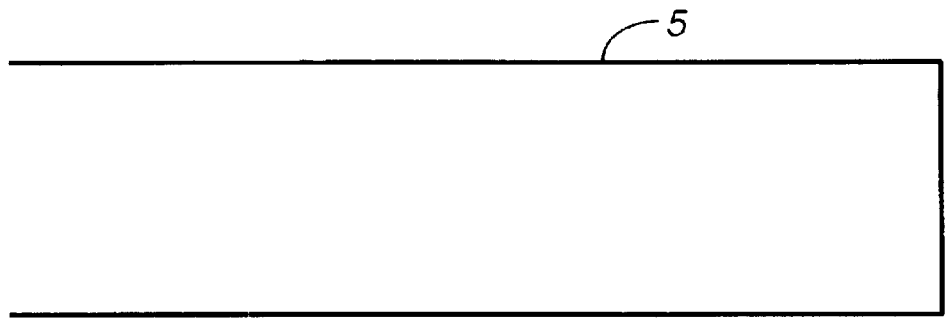
FIG._3A
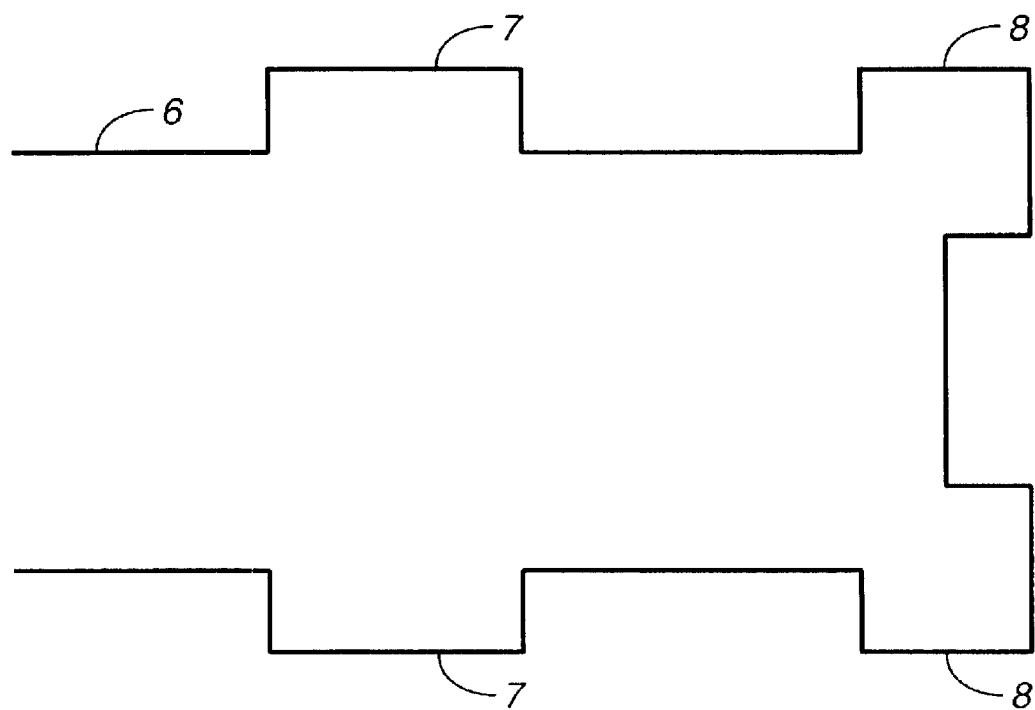
FIG._3B

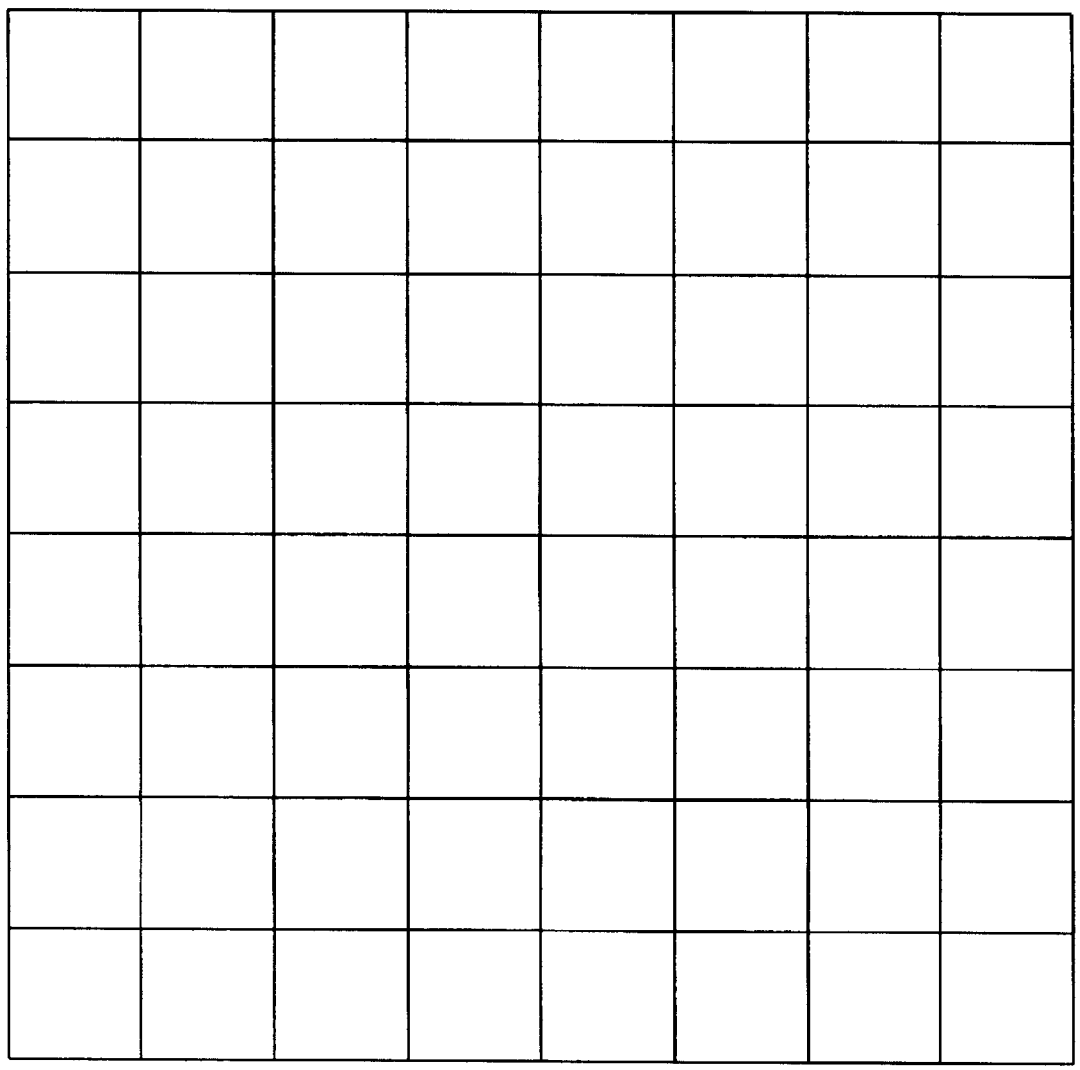
FIG._4

| 1,8 | 2,8 | 3,8 | 4,8 | 5,8 | 6,8 | 7,8 | 8,8 |
|-----|-----|-----|-----|-----|-----|-----|-----|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

*FIG._5*

| 1,8 | 2,8 | 3,8 | 4,8 | 5,8 | 6,8 | 7,8 | 8,8 |
|-----|-----|-----|-----|-----|-----|-----|-----|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

FIG._6A

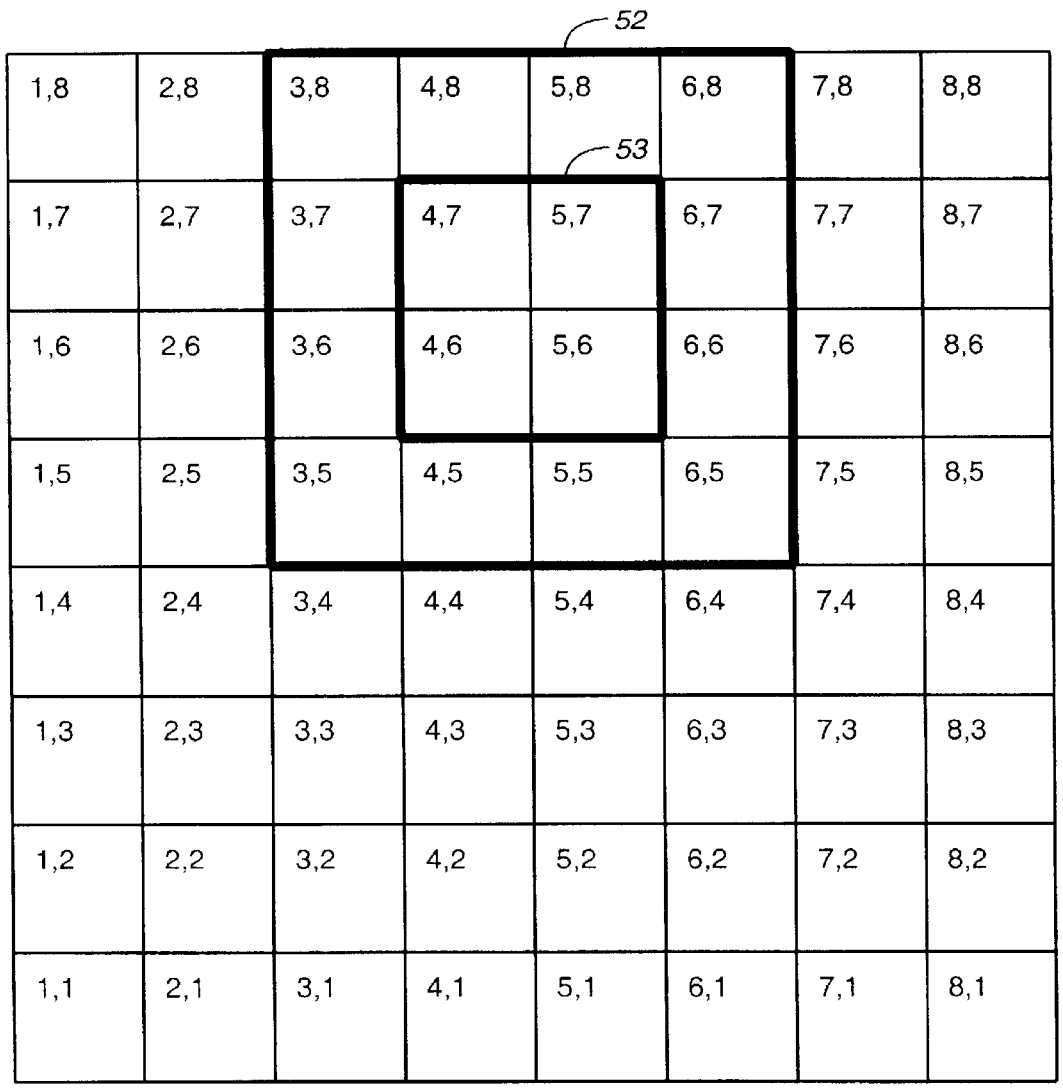
FIG._6B

| 1,8 | 2,8 | 3,8 | 4,8 | 5,8 | 6,8 | 7,8 | 8,8 |
|---|---|---|---|---|---|---|---|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

*FIG._6C*

| 1,8 | 2,8 | 3,8 | 4,8 | 5,8 | 6,8 | 7,8 | 8,8 |
|---|---|---|---|---|---|---|---|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

*FIG._6D*

| 1,8 | 2,8 | 3,8 | 4,8 | 5,8 | 6,8 | 7,8 | 8,8 |
|-----|-----|-----|-----|-----|-----|-----|-----|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

FIG._6E

| 1,8 | 2,8 | 3,8 | 4,8 | 5,8 | 6,8 | 7,8 | 8,8 |
| --- | --- | --- | --- | --- | --- | --- | --- |
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

*FIG._6F*

| 1,8 | 2,8 | 3,8 | 4,8 | 5,8 | 6,8 | 7,8 | 8,8 |
|-----|-----|-----|-----|-----|-----|-----|-----|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

FIG._6G

| 1,8 | 2,8 | 3,8 | 4,8 | 5,8 | 6,8 | 7,8 | 8,8 |
|---|---|---|---|---|---|---|---|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

FIG._6H

| 1,8 | 2,8 | 3,8 | 4,8 | 5,8 | 6,8 | 7,8 | 8,8 |
|---|---|---|---|---|---|---|---|
| 1,7 | 2,7 | 3,7 | 4,7 | 5,7 | 6,7 | 7,7 | 8,7 |
| 1,6 | 2,6 | 3,6 | 4,6 | 5,6 | 6,6 | 7,6 | 8,6 |
| 1,5 | 2,5 | 3,5 | 4,5 | 5,5 | 6,5 | 7,5 | 8,5 |
| 1,4 | 2,4 | 3,4 | 4,4 | 5,4 | 6,4 | 7,4 | 8,4 |
| 1,3 | 2,3 | 3,3 | 4,3 | 5,3 | 6,3 | 7,3 | 8,3 |
| 1,2 | 2,2 | 3,2 | 4,2 | 5,2 | 6,2 | 7,2 | 8,2 |
| 1,1 | 2,1 | 3,1 | 4,1 | 5,1 | 6,1 | 7,1 | 8,1 |

*FIG._61*

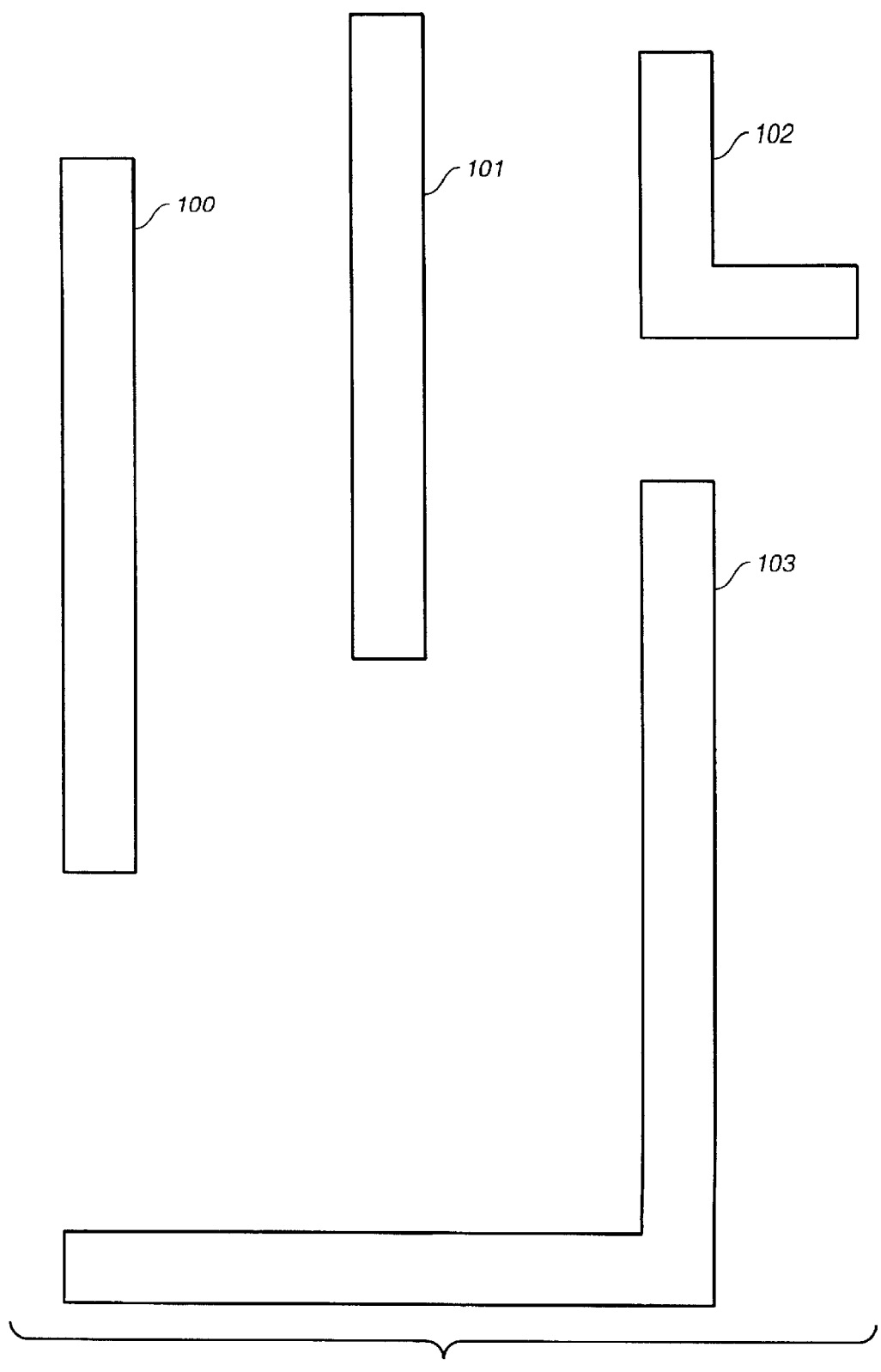
FIG._7

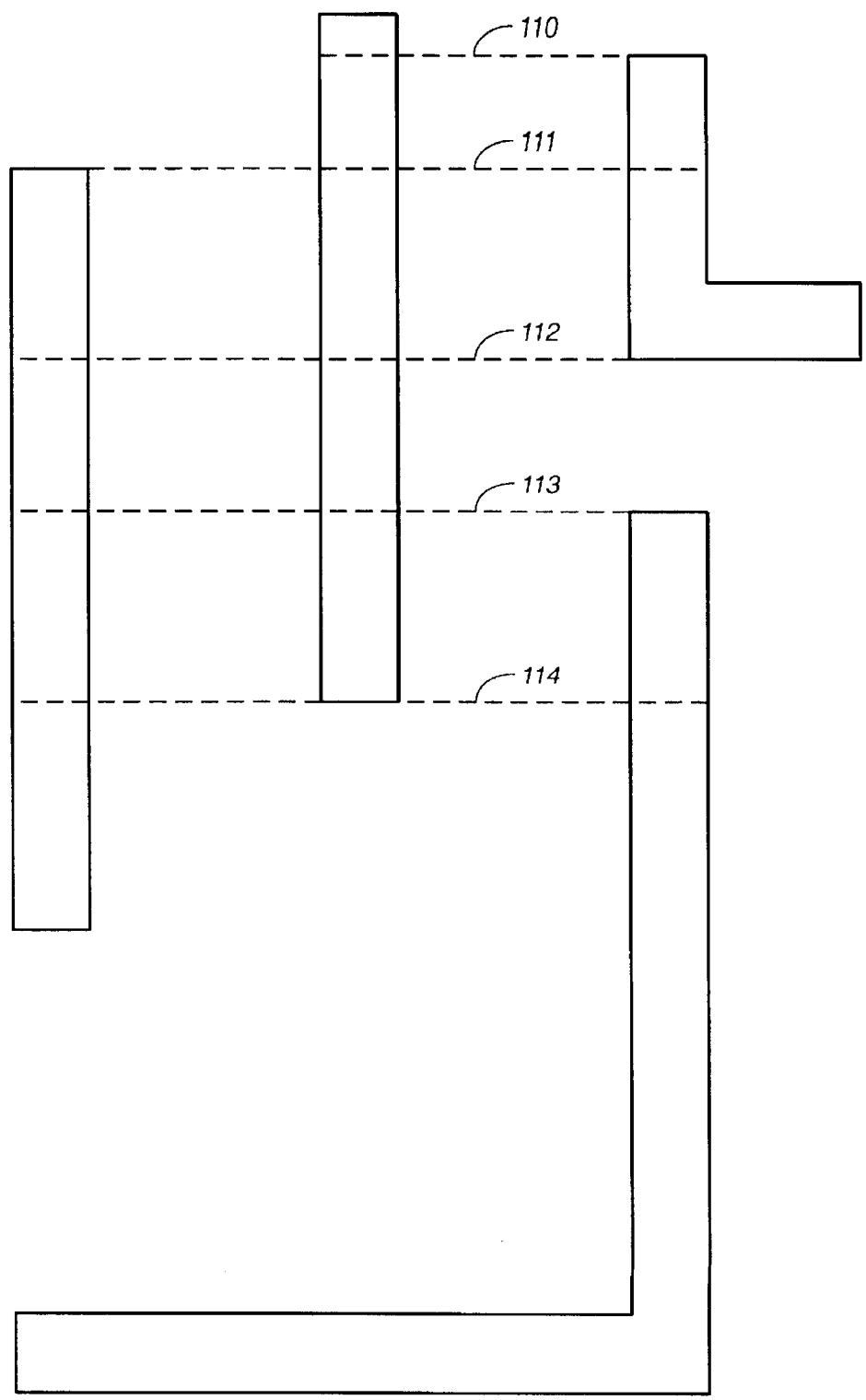
FIG._8

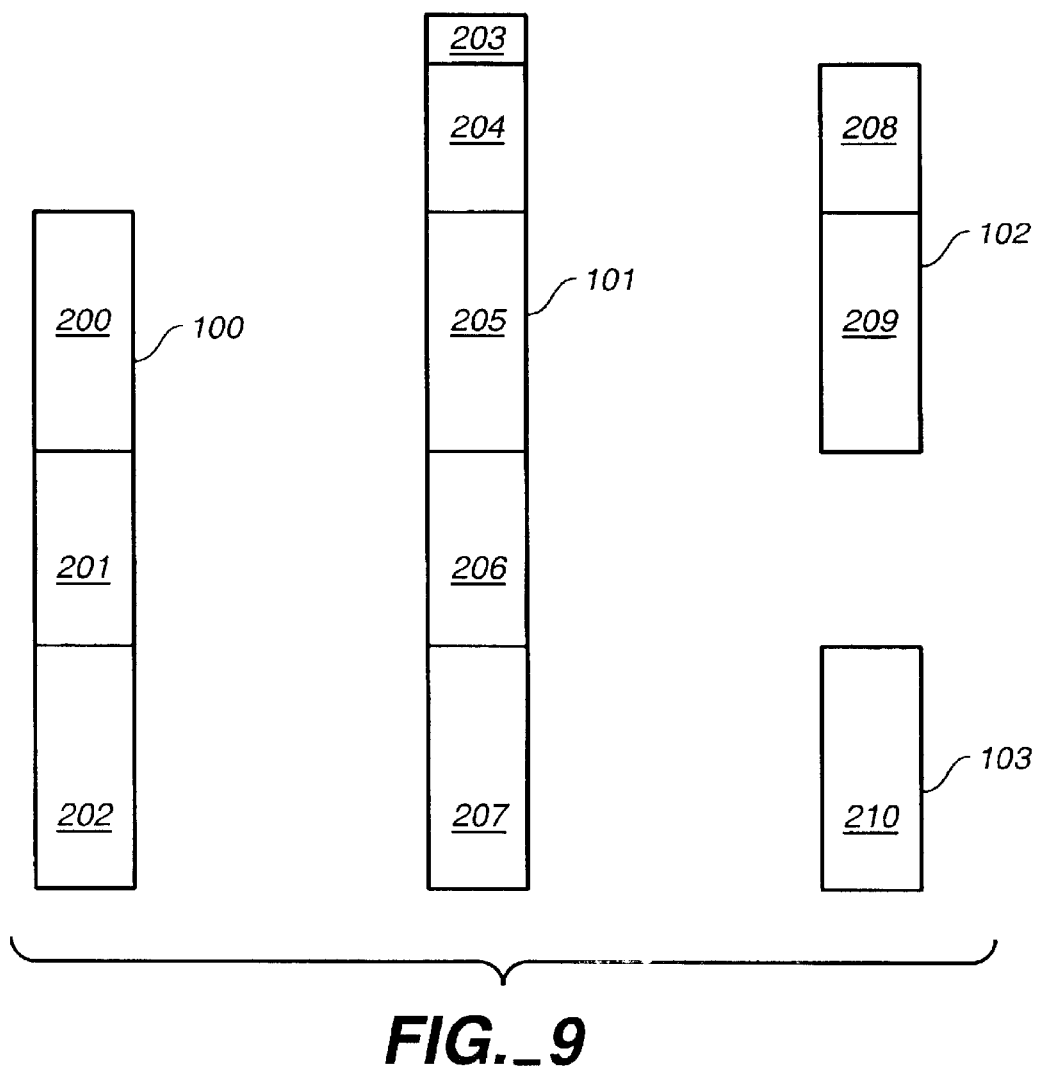
FIG._9

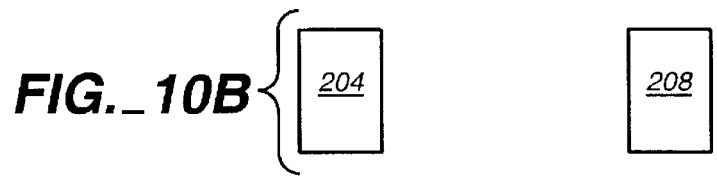
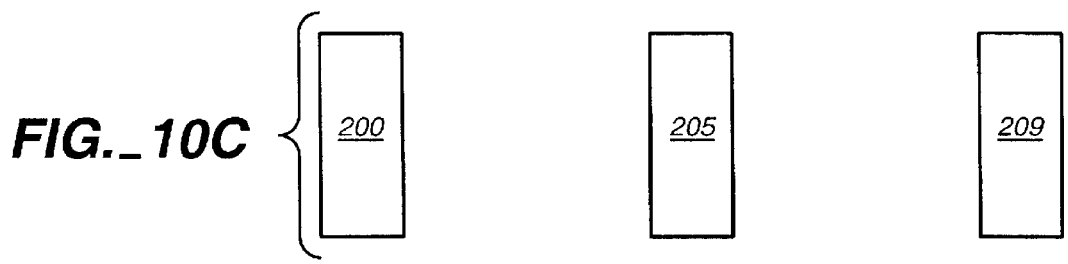
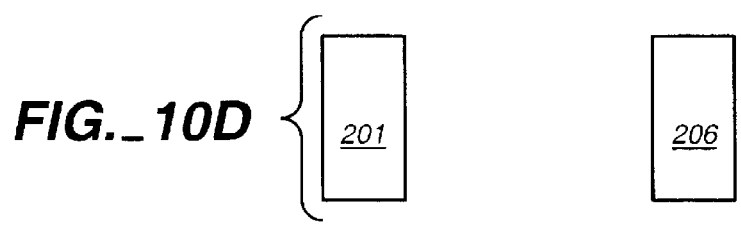
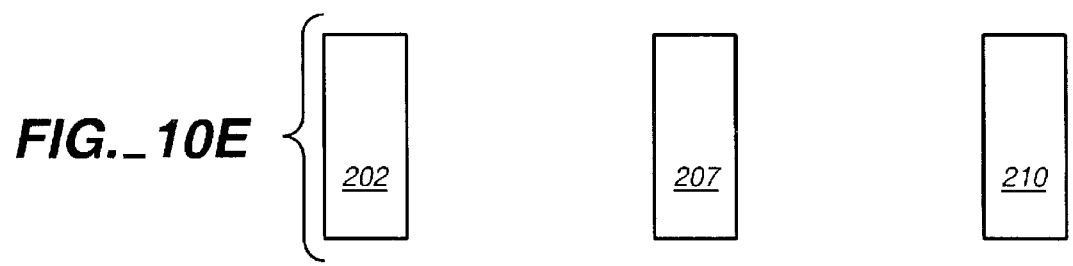

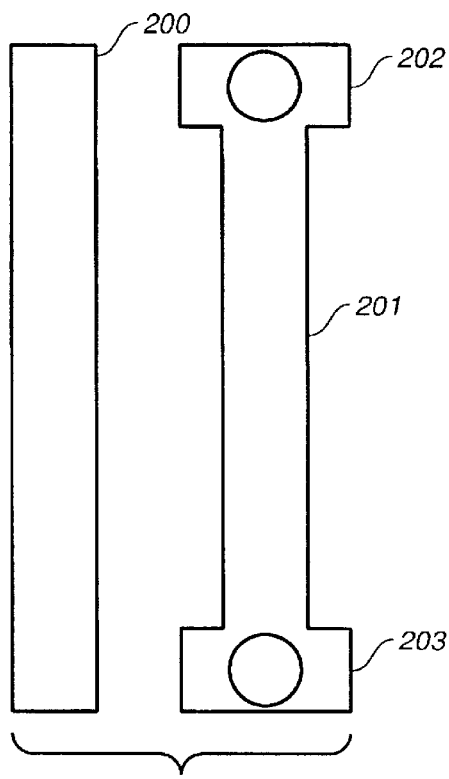
*FIG._11*
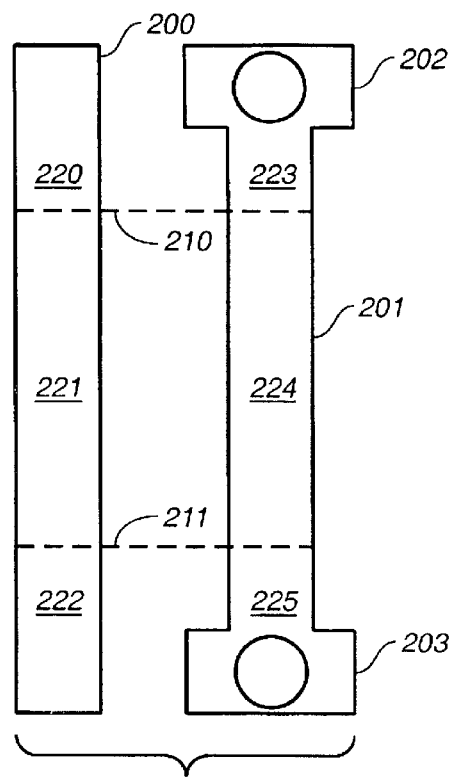
*FIG._12*
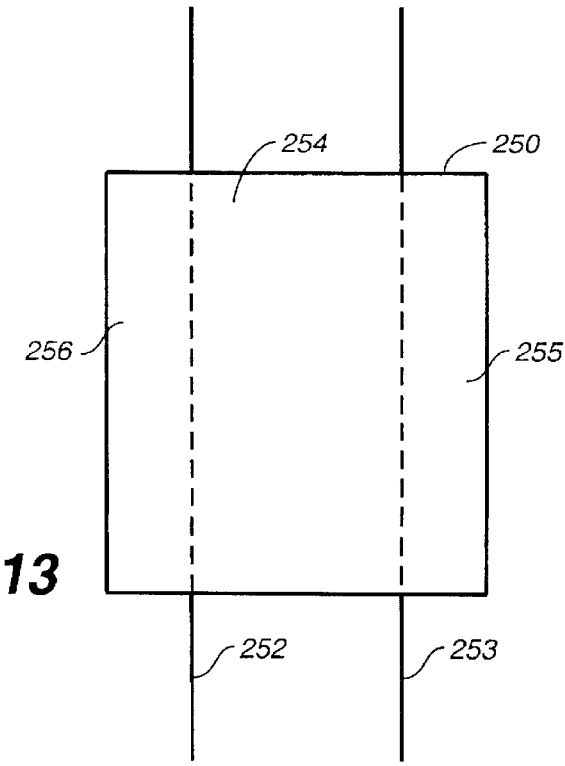
*FIG._13*

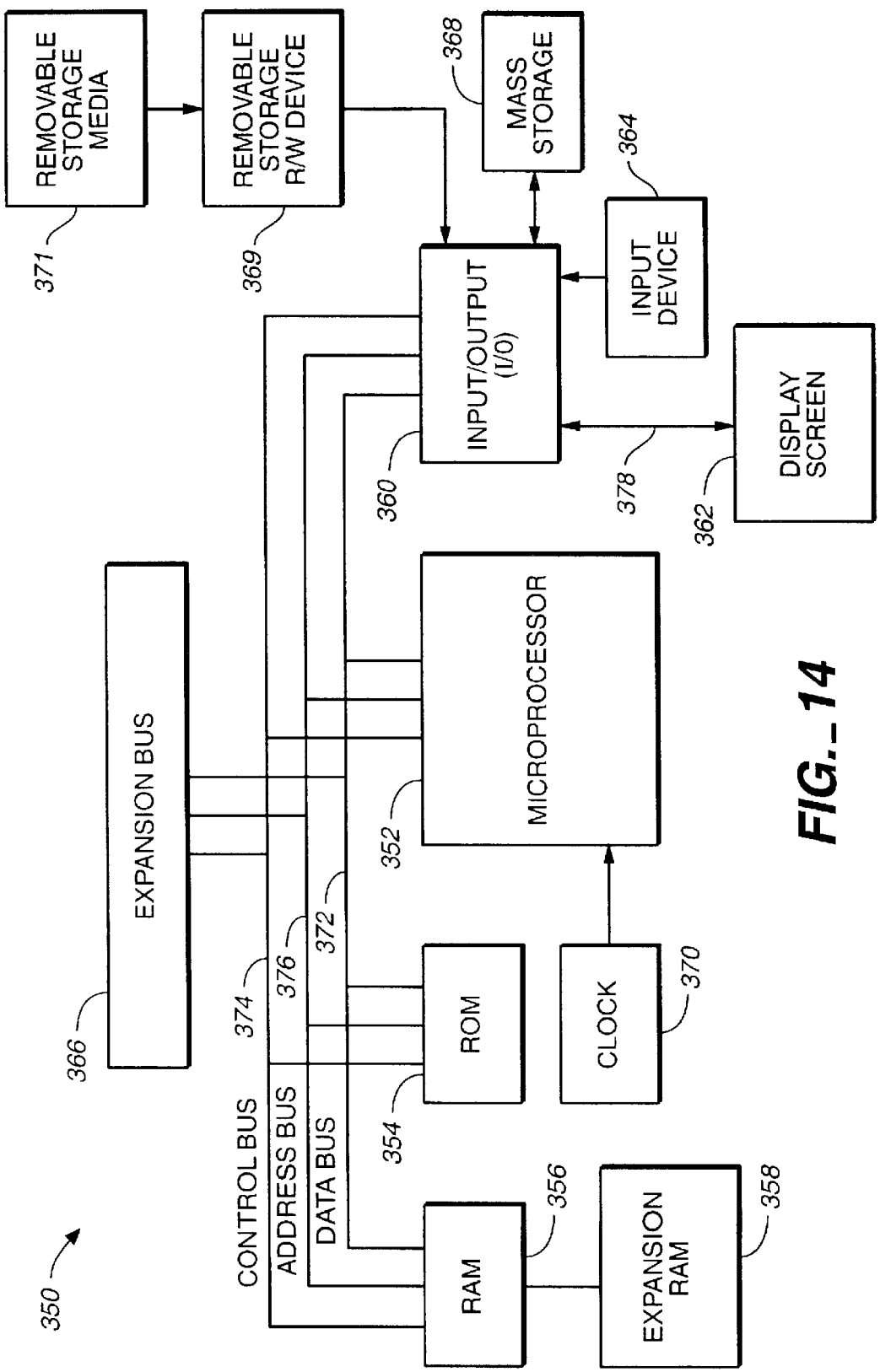
FIG._14

METHOD AND APPARATUS FOR APPLICATION OF PROXIMITY CORRECTION WITH RELATIVE SEGMENTATION

This application is a divisional of application Ser. No. 09/034,550, filed Mar. 3, 1998 now U.S. Pat. No. 6,174,630.

BACKGROUND OF THE INVENTION

Field of the Invention

The present invention concerns the field of semiconductor wafer fabrication. Specifically, it relates to the correction of proximity effects in patterning.

A. Wafer Construction.

Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Construction of semiconductor wafers with these steps is well known in the art of semiconductor fabrication. Examples of wafer construction processes are described in U.S. Pat. No. 5,679,598 issued to Yee on Oct. 21, 1997, entitled "Method of Making a CMOS Dynamic Random-Access Memory (DRAM)," U.S. Pat. No. 5,663,076 issued to Rostoker et al. on Sep. 2, 1997, entitled "Automating Photolithography in the Fabrication of Integrated Circuits," U.S. Pat. No. 5,595,861 issued to Garza on Jan. 21, 1997, entitled "Method of Selecting and Applying a Top Antireflective Coating of a Partially Fluorinated Compound," U.S. Pat. No. 5,444,265 issued to Hamilton on Aug. 22, 1995, entitled "Method and Apparatus for Detecting Defective Semiconductor Wafers During Fabrication Thereof," and U.S. Pat. No. 4,652,134 issued to Pasch et al. on Mar. 24, 1987, entitled "Mask Alignment System." The specifications of these five patents identified in this paragraph are hereby incorporated herein as though set forth in full by this reference.

B. Patterning And Proximity Effects.

As the most critical operation of wafer fabrication, patterning sets the critical dimensions of the particular semiconductor device. Errors in the patterning process can cause distortions that cause changes in the function of the semiconductor device.

Design rule limitations are frequently referred to as critical dimensions. A critical dimension of a circuit is commonly defined as the smallest width of a line or the smallest space between two lines. Consequently, the critical dimension determines the overall size and density of an integrated circuit (IC). In present IC technology the smallest critical dimension for state-of-the-art circuits is 0.3 micron for line widths and spacings. Once the layout of the circuit has been created, the next step to manufacturing the integrated circuit is to transfer the layout onto a semiconductor substrate, Photolithography is a well known process for transferring geometric shapes present on a mask onto the surface of a silicon wafer. In the field of IC lithographic processing a photosensitive polymer film called photoresist is normally applied to a silicon substrate wafer and then allowed to dry. An exposure tool is utilized to expose the wafer with the proper geometrical patterns through a mask (or reticle) by means of a source of light or radiation. After exposure, the wafer is treated to develop the mask images transferred to the photosensitive material. These masking patterns are then used to create the device features of the circuit.

An important limiting characteristic of the exposure tool is its resolution value. The resolution for an exposure tool is defined as the minimum feature that the exposure tool can repeatedly expose onto the wafer. Currently, the resolution for most advanced optical exposure tools is around 0.2 micron. Thus, the resolution value of present lithographic equipment is close to the critical dimension for most IC circuit designs. Consequently, the resolution of the exposure tool may influence the final size and density of the IC circuit. As the critical dimensions of the layout becomes smaller and approach the resolution value of the lithography equipment, the consistency between the masked and actual layout pattern developed in the photoresist is significantly reduced. Specifically, it is observed that differences in pattern development of circuit features depends upon the proximity of the features to one another.

The magnitude of such proximity effects depends on the proximity or closeness of the two features present on the masking pattern. Proximity effects are known to result from optical diffraction in the projection system. This diffraction causes adjacent features to interact with one another in such a way to produce pattern-dependent variations.

Proximity effects and methods for correcting for them are discussed in U.S. Pat. No. 5,682,323 issued on Oct. 28, 1997, to Pasch et al. entitled "System and Method for Performing Optical Proximity Correction on Macrocell Libraries" (hereinafter the "Pasch '323 patent"). The specification of the Pasch '323 patent is incorporated herein as though set forth in full by this reference, The system and method described in the Pasch '323 patent performs optical proximity correction on an integrated circuit mask design by initially performing optical proximity correction on a library of cells that are used to create the IC. The pre-tested cells are imported onto a mask design. All cells are placed a minimum distance apart to ensure that no proximity effects will occur between elements fully integrated in different cells. An optical proximity correction technique is performed on the mask design by performing proximity correction only on those components, e.g., lines, that are not fully integrated within one cell.

Proximity effects and methods for correcting for them are also discussed in U.S. Pat. No. 5,705,301 issued on Jan. 6, 1998, to Garza et al. entitled "Performing Optical Proximity Correction with the Aid of Design Rule Checkers" (hereinafter the "Garza '301 patent"). The specification of the Garza '301 patent is incorporated herein as though set forth in full by this reference. The system described in the Garza '301 patent involves a method for identifying regions of an integrated circuit layout design where optical proximity correction will be most useful and then performing optical proximity correction on those regions only.

More specifically, the method includes the following steps: (a) analyzing an integrated circuit layout design with a design role checker to locate features of the integrated circuit layout design meeting predefined criteria; and (b) performing optical proximity correction on the features meeting the criteria in order to generate a reticle design. The criteria employed by the design rule checker to select features include outside corners on patterns, inside corners on features, feature size, feature shape, and feature angles.

C. Proximity Effect Correction.

A technique related to proximity effects involves the use of modified shapes or adjacent subresolution geometries to improve imaging. An example of this is the use of serifs on the corners of contacts. FIGS. 1A and 1B show contacts as formed on a reticle. FIG. 1A shows a contact 1 without serifs. FIG. 1B shows the same contact 2 with serifs. For contacts with dimensions near the resolution limit of the optics, a square pattern on the reticle will print more nearly as a circle. Additional geometries on the corners such as those shown in FIG. 1B will help to square the corners of the contract. Techniques such as those reflected by FIGS. 1A and 1B are often called proximity correction.

In addition for corner rounding for rectangular features, there is also the issue of line shortening. FIG. 2A shows a rectangle 3 as drawn on a reticle with a width W and a length L. Printed to size on the wafer as shown in FIG. 2B, the rectangle has a length L' and width W' 4. Where there is room, rectangles can be biased longer on the reticle to give printed features of the desired length.

FIG. 3A shows a conventional pattern 5 and FIG. 3B shows a corresponding proximity correction pattern 6 wherein width variation 7 has been added to compensate for effects of adjacent features and serifs 8 have been added to corners to reduce corner rounding and feature length shortening.

Other examples of proximity effects and the adjustments made to patterns in order to correct for such effects are provided in the Garza '301 patent discussed above In particular, FIGS. 1A, 1B, 1C, 1D, 2A, 5, 5A, 5B, 5C, 5D, 6, 7A, 7B, 7C, and 8 of the Garza '301 patent provide such examples.

Proximity effects are a well-known phenomenon in electron beam lithography, where they result from electron scattering. In optical lithography proximity effects are caused by the phenomenon of diffraction. As a consequence of proximity effects, printed features do not have simple relationships to reticle dimensions. This creates a situation in which it is difficult to fabricate a photomask where the designer gets what he or she wants on the wafer. Unless otherwise expressly indicated in a claim herein, it is intended that the claimed invention can be applied to correct for proximity effects whether the proximity effects are optical, electron beam, x-ray or otherwise.

Some limited form of proximity correction has been in use for at least two or three decades. These pattern modifications were usually requested by a wafer engineer based on knowledge of a particular process step. In recent years, proximity correction has become more of a science that an art due to the introduction of several proximity correction software programs. The proximity correction process consists of measuring several generic test patterns processed on a wafer and constructing a multilevel lookup table from the measured data.

SUMMARY OF THE INVENTION

An object of the present invention is to provide for a method and apparatus for one-dimensional application of optical proximity correction to a desired pattern. The present invention is a method and apparatus for applying one-dimensional proximity correction to a piece of a mask pattern, by segmenting a first piece of a mask pattern with horizontal dividing lines into a plurality of segments, segmenting a second piece of said mask pattern with said horizontal dividing lines into a second plurality of segments, and applying proximity correction to a first segment from said first plurality of segments taking into consideration a second segment from said second plurality of segments.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 1A shows a contact as formed on a reticle.

FIG. 1B shows a contact as formed on a reticle.

FIG. 2A shows a rectangle as drawn on a reticle with a width W and a length L.

FIG. 2B shows the rectangle with a length L' and width W' as formed on the wafer.

FIG. 3A shows a conventional pattern on a reticle.

FIG. 3B shows a corresponding proximity correction pattern wherein width variation has been added to compensate for effects of adjacent features and serifs have been added to corners to reduce corner rounding and feature length shortening.

FIG. 4 is an 8-by-8 grid wherein the grid represents a portion of a desired pattern, wherein the pattern has been divided into grid squares for purposes of systematic proximity correction treatment.

FIG. 5 identifies the various squares in the grid.

FIG. 6A reflects an inner square and an outer square on the grid.

FIG. 6B reflects an inner square and an outer square on the grid.

FIG. 6C reflects an inner square and an outer square on the grid.

FIG. 6D reflects an inner square and an outer square on the grid.

FIG. 6E reflects an inner square and an outer square on the grid.

FIG. 6F reflects an inner square and an outer square on the grid.

FIG. 6G reflects an inner square and an outer square on the grid.

FIG. 6H reflects an inner square and an outer square on the grid.

FIG. 6I reflects an inner square and an outer square on the grid.

FIG. 7 depicts an exemplary pattern on a routing layer.

FIG. 8 depicts the step of segmenting a vertical piece and the pieces adjacent to it in the x-direction.

FIG. 9 shows the particular segments created by the dividing lines.

FIGS. 10A–E depict corresponding segments from adjacent pieces.

FIG. 11 depicts two pieces from a pattern of a routing layer.

FIG. 12 reflects the preferred approach to vias.

FIG. 13 depicts a piece segmented by lines corresponding to power rails.

FIG. 14 is a block diagram which illustrates the proximity correction system environment claimed herein.

DETAILED DESCRIPTION OF THE PREFERRED EMBODIMENT(S)

A. Proximity Correction: General Case.

According to the present invention, there exists a desired pattern for imprinting on to a wafer surface. Generally, this pattern in in digitized form stored in memory of a general purpose computer. However, if a mask is created with the identical pattern, proximity effects will create unwanted variations in the imprint, which may influence the performance of the IC.

FIG. 4 is an 8-by-8 grid 20. The grid represents a portion of a desired pattern, wherein the pattern has been divided into grid squares for purposes of systematic proximity correction treatment. Each square is r wide, where r is the radius of influence with respect to proximity effects. In other words, in applying proximity correction to a particular object, we are not concerned with objects more than a distance r from the object at hand.

For example, if there is no object within r from the square object shown in FIG. 1A, our proximity correction of the square object might consist merely of adding serifs as shown in FIG. 1B. However, if another object is closer than r to the square object, additional proximity correction techniques might be applied as needed.

The value of r will generally be determined before operation of the present invention by the operator. The value of r may reflect a tradeoff between accuracy and efficiency. In other words, the larger r the more accurate the proximity correction application; the smaller r the less costly the application of the present invention. The value of r could be calculated in some fashion or chosen based upon experience and empirical data. Typically, using optical masking technology, r will be between 10 to 50 nanometers. Preferably, r will be between 15 and 40 nanometers. More preferably, r will be between 20 and 35 nanometers. Most preferably, r will be approximately 25 nanometers.

For purposes of our proximity correction system, we have a library stored in memory in the form of a lookup table which identifies the appropriate proximity corrections for the various patterns which we might encounter. The library entries are based upon empirical data and might include, for example, the proximity correction treatments reflected by FIGS. 1A and 1B. FIGS. 2A and 2B and FIGS. 3A and 3B. Each library entry concerns a specific pattern for a square with dimensions of 4r (i.e. 16 squares in the grid in FIG. 4) and contains the appropriate proximity correction for that pattern. Generally, it would be expected that about $2^{16}$ library entries would be required. Although there would be numerous entries, each entry would only have to be determined once.

The proximity correction library is then applied systematically to the desired pattern. For purposes of systematic application of the proximity correction library, the various squares in the grid are identified as shown in FIG. 5. Each square is identified by its x-coordinate followed by its y-coordinate, with the origin of the grid at the bottom left corner.

FIG. 6A shows the operation of the present invention. Shown on FIG. 6A is an inner square 51 and an outer square 50. The inner square 51 comprises the following grid squares: (2, 7); (3, 7); (2, 6); and (3, 6). The dimensions of the inner square are 2r. The outer square 50 comprises the inner square and the following additional grid squares: (1, 8); (2, 8); (3, 8); (4, 8); (1, 7); (4, 7); (1, 6); (4, 6); (1, 5); (2, 5); (3, 5); and (4, 5). As can be seen, the dimensions of the outer square 50 are 4r.

For the outer square 50 we check our library for the appropriate entry. The entry concerns only the portion of the pattern contained inside the outer square. We then apply the proximity correction specified by the entry to the inner square only. The correction to the inner square is then saved in memory. As should be apparent, the border of the inner square is 1r away from the border of the outer square.

FIG. 6B reflects the next step. In FIG. 6B there is an outer square 52 and inner square 53. These inner and outer squares are the same dimensions as the respective inner and outer squares in FIG. 6A. We follow the same operation as we did with respect to FIG. 6A. In our preferred embodiment, we do not consider the corrections that were made to inner square 51 in the previous step. Rather, the pattern contained within grid squares (3, 7) and (3, 6) is our desired pattern. However, it is possible to consider the corrected pattern for these two grid squares if desired.

We then continue this correction process in the order as reflected by FIG. 6C (outer square 54 and inner square 55), FIG. 6D (outer square 56 and inner square 57), FIG. 6E (outer square 58 and inner square 59), FIG. 6F (outer square 60 and inner square 61). FIG. 6G (outer square 62 and inner square 63), FIG. 6H (outer square 64 and inner square 65), FIG. 6I (outer square 66 and inner square 67).

It should be noted that the order of correction could be different. For example, we might institute corrections in the following order: Inner square 51; inner square 53; inner square 57; and inner square 59. Further, configurations other than squares could be used. For example, we might use outer and inner rectangles other than squares. In this instance, it would generally be desirable that the dimensions of the outer rectangle be 2r greater than the dimensions of the inner rectangle. In addition, we might round the corners of the outer square or rectangle such that all points on the outer square or rectangle are exactly the distance r from the closest point on the inner square or rectangle.

Finally, it should be noted that the present invention can operate with either a single processor or with parallel processors. Therefore, we might utilize a single processor to make the corrections one inner square at a time. Or we can divide the inner squares such that inner squares are assigned to different processors and the proximity correction operations are conducted in parallel.

Where the operations are accomplished in parallel, we can treat neighboring inner squares simultaneously if we consider only the desired pattern in applying our corrections to the inner squares. However, if we wish to consider previous proximity corrections made during operation of the present invention, neighboring inner squares should not be operated on at the same time.

After we have made our corrections, we reconstitute our pattern such that our corrections are included. Further, proximity correction operations may then be effected if desired. From our corrected pattern, we can make our mask and form the semiconductor wafer according to our design.

B. Proximity Correction: Segmentation

In addition to the general method for applying proximity correction, pieces can be segmented and individualized proximity correction can be applied to the individual segments. We have developed two basic methods for applying proximity correction to segments, relative segmentation and unitary segmentation, each of which is described below.

1. Relative Segmentation.

Lines designed to have the same dimension, but which are placed in different proximity to other features in a layout (isolated vs. densely packed), will not have the same dimensions after being developed. Thus, a group of densely packed lines tends to transfer differently when compared with an isolated line. Significant problems can arise in an IC when line widths are not consistently reproduced.

This problem is of concern with respect to, for example, routing layers of a wafer. To a large extent, the patterns on the routing layers consist of horizontal and vertical wiring lines. An exemplary pattern on a routing layer is reflected by FIG. 7. Shown on FIG. 7 are a vertical piece 100, another vertical piece 101, an L-shaped piece 102, and another L-shaped piece 103.

With such a routing pattern, an proximity correction method with relative segmentation can be applied. For purposes of this example, we intend to apply proximity correction in the x-direction with respect to vertical piece 101.

The first step in our proximity correction with relative segmentation method is to segment vertical piece 101 and the pieces adjacent to it in the x-direction. To obtain the appropriate segments we segment the affected segments with dividing lines 110, 111, 112, 113 and 114. Each of these lines is derived from a physical structure on one of the considered pieces, namely here an end point of a piece. This is shown in FIG. 8.

FIG. 9 shows the particular segments created by the dividing lines. Piece 100 has three segments, 200, 201 and 202. Piece 101, the piece to which we plan to apply proximity correction, is divided into five segments, 203, 204, 205, 206 and 207. Piece 102 is divided into two segments, 208 and 209, and piece 103 provides one segment, 210.

It should be noted that in the embodiment shown here, only segments contained within y-boundaries established by the end points of piece 101 are considered. Also, it should be noted that we do not consider the horizontal leg of piece 102.

As can be seen in FIG. 9, each segment of piece 101 is in one of four basic situations. The first situation is that of having no adjacent segments. This is exemplified by segment 203 as can be seen by FIG. 10A.

The second situation is having an adjacent segment only to the left. This is exemplified by segment 206 as can be seen in FIG. 10D. The third situation is having an adjacent segment only to the right. This is exemplified by segment 204, as is shown in FIG. 10B. Finally, the fourth situation is having adjacent segments to both the right and the left. This is exemplified by segments 205 and 207, as shown by FIGS. 10C and 10E, respectively;

After segmentation, proximity correction is then applied for each segment in the subject piece, namely piece 101. In applying proximity correction to each segment, the segment and the segments (if there are any) adjacent in the x-direction are considered. For example, with respect to segment 205, only segments 205, 201 and 209 are considered. With respect to segment 203, only segment 203 is considered. With respect to segment 206, only segments 206 and 201 are considered.

Because each segment of piece 101 is in one of four situations, it is possible to have an proximity correction library with only a minimal number of entries. However, the method may also take into account the length of the segments, in which case additional library entries may be required. Also end segments (such as segments 204 and 207) and corner segments require special treatment due to proximity effects which cause round-off at corners.

In the preferred embodiment, the segmentation and proximity correction process is carried out with respect to each piece in the pattern. Also, in the preferred embodiment, the proximity correction carried out with respect to one segment is not considered when later applying proximity correction to a segment adjacent to the first segment. However, if desired, it is possible to consider the proximity correction applied to the first segment.

Further, it would be expected that the segmentation and proximity correction process would be carried out with respect to horizontal segments as well. In that case, the proximity correction to a horizontal segment would take into account segments adjacent to the first segment in the y-direction and the dividing lines would be vertical instead of horizontal. After the relative segmentation proximity correction method described above is applied to a pattern, additional proximity correction procedures may be carried out for the pattern as needed or desired.

In applying the relative segmentation proximity correction procedures discussed above, certain complications may arise. For example, a routing layer may have connections between wires and cells, which are typically called vias. Vias are vertical openings filled with conducting material used to connect circuits on various layers of a device to one another and to the semiconducting substrate. Vias serve the same purpose as "contacts."

A wire with a via at the end(s) may have a shape similar to that of a dog bone. FIG. 11 depicts two pieces from a pattern of a routing layer. The first piece 200 is a straight vertical piece. The second piece 201 is also a vertical piece, but has two vias such that both ends (202 and 203) of the piece are wider than the wire portion giving the piece the appearance of a dog bone. With respect to the vias, one of two basic approaches can be taken in applying the relative segmentation proximity correction method. First, the segments with vias can be ignored and treated later with a two dimensional proximity correction method. Second, the segments with vias can be considered and treated during the relative segmentation proximity correction process. Treating vias during the relative segmentation proximity correction process would add complexity to the process. However, if the via portions are of consistent width, it may be possible to treat the via portions during this relative segmentation proximity correction process without too much more complexity.

FIG. 12 reflects the preferred approach to vias. Two dividing lines (210 and 211) divide pieces 200 and 201 into segments. Piece 200 is divided into segments 220, 221 and 222 and piece 201 is divided into segments 223, 224 and 225.

Note that the dividing lines do not divide the pieces exactly where the end portions (203 and 202) of piece 201 meet the wire portion of that piece. This is because the end portions will also cause proximity effects on the wire portion of the same piece. Therefore, the dividing lines are far enough away from the end portions such that any proximity effects caused the end portions to segment 224 are not significant.

Assuming we intend to apply proximity correction to piece 201, we apply proximity correction only to segment 224, taking into consideration segment 221. Likewise, if we intend to apply proximity correction to piece 200, we apply proximity correction only to segment 221, taking into consideration segment 224. The other segments are noted in memory and left for treatment later with a two dimensional method. Corners may also require treatment different than that applied to straight segments.

2. Unitary Segmentation.

Segmentation can also be used for proximity correction wherein the segmentation of a particular piece is accomplished without reference to another piece which is also segmented. In other words, only a single piece need be segmented before application of proximity correction. FIG. 13 shows a piece 250 which is placed on a layer of an integrated circuit device having power rails (252 and 253). In this instance, the piece overlaps each of the power rails. Utilizing the power rails as demarcations, the piece can be divided into three segments, one segment 254 positioned between the rails, one segment 255 positioned to the right of the right rail, and one segment 256 positioned to the left of the left rail.

We can then apply proximity correction measures to the middle segment 254 by itself, taking into consideration the proximity effects caused by the power rails. We do not need to consider the proximity effects caused by other structures (including the two segments which are outside the power rails) because such effects would be de minimis with respect to those caused by the power rails. After making the proximity corrections to the center segment, the center segment can be stored without further correction. Generally, the proximity correction would involve the subtraction of serifs at the inside corners formed by the power rails and the inner cell segment. [See, Garza '301 Patent, col. 11, 11. 45–46.]

This method of unitary segmentation can be combined with the invention described in the Pasch '323 patent discussed above and incorporated herein by reference. Proximity correction can first be applied to a pattern as described in the Pasch '323 patent, then the unitary segmentation method can be utilized to correct for the effects of other features, such as power rails as described above. Likewise, the invention described in the Pasch '323 patent can also be combined with relative segmentation proximity correction method described above.

C. Proximity Correction System Environment.

Generally, the methods described herein with respect to proximity correction will be practiced with a general purpose computer, either with a single processor or multiple processors. Generally, a pattern will be supplied in a digitized form. The particular proximity correction method desired will then be performed by a general purpose computer so as to modify the digitized representation of the pattern. The modified pattern will then be utilized in forming a mask.

FIG. 14 is an illustration of a general purpose computer system, representing one of many suitable computer platforms for implementing the inventive optical proximity correction methods described above. FIG. 14 shows a general purpose computer system 350 in accordance with the present invention includes a central processing unit (CPU) 352, read only memory (ROM) 354, random access memory (RAM) 356, expansion RAM 358, input/output (I/O) circuitry 360, display assembly 362, input device 364, and expansion bus 366. Computer system 350 may also optionally include a mass storage unit 368 such as a disk drive unit or nonvolatile memory such as flash memory and a real-time clock 370.

CPU 352 is coupled to ROM 354 by a data bus 372, control bus 374, and address bus 376. ROM 354 contains the basic operating system for the computer system 350. CPU 352 is also connected to RAM 356 by busses 372, 374, and 376. Expansion RAM 358 is optionally coupled to RAM 356 for use by CPU 352. CPU 352 is also coupled to the I/O circuitry 360 by data bus 372, control bus 374, and address bus 376 to permit data transfers with peripheral devices.

I/O circuitry 360 typically includes a number of latches, registers and direct memory access (DMA) controllers. The purpose of I/O circuitry 360 is to provide an interface between CPU 352 and such peripheral devices as display assembly 362, input device 364, and mass storage 368.

Display assembly 362 of computer system 350 is an output device coupled to I/O circuitry 360 by a data bus 378. Display assembly 362 receives data from I/O circuitry 360 via bus 378 and displays that data on a suitable screen.

The screen for display assembly 362 can be a device that uses a cathode-ray tube (CRT), liquid crystal display (LCD), or the like, of the types commercially available from a variety of manufacturers. Input device 364 can be a keyboard, a mouse, a stylus working in cooperation with a position-sensing display, or the like. The aforementioned input devices are available from a variety of vendors and are well known in the art.

Some type of mass storage 368 is generally considered desirable. However, mass storage 368 can be eliminated by providing a sufficient-mount of RAM 356 and expansion RAM 358 to store user application programs and data. In that case, RAMs 356 and 358 can optionally be provided with a backup battery to prevent the loss of data even when computer system 350 is turned off. However, it is generally desirable to have some type of long term mass storage 368 such as a commercially available hard disk drive, nonvolatile memory such as flash memory, battery backed RAM, PC-data cards, or the like.

A removable storage read/write device 369 may be coupled to I/O circuitry 360 to read from and to write to a removable storage media 371. Removable storage media 371 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 350 by typing on a keyboard, manipulating a mouse or trackball, or "writing" on a tablet or on position-sensing screen of display assembly 362. CPU 352 then processes the data under control of an operating system and an application program stored in ROM 354 and/or RAM 356. CPU 352 then typically produces data which is outputted to the display assembly 362 to produce appropriate images on its screen.

Expansion bus 366 is coupled to data bus 372, control bus 374, and address bus 376. Expansion bus 366 provides extra ports to couple devices such as network interface circuits, modems, display switches, microphones, speakers, etc. to CPU 352. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations, or personal computers.

It should be understood that the present invention also relates to machine readable media on which are stored reticle designs meeting the requirements of this invention, or program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

What is claimed is:

1. An apparatus for applying one-dimensional proximity correction to a piece of a mask pattern, said apparatus comprising:
   a. Means for segmenting a first piece of a mask pattern with a first plurality of dividing lines into a plurality of segments;
   b. means for segmenting a second piece of said mask pattern with said first plurality of dividing lines into a second plurality of segments; and
   c. means for applying proximity correction to a first segment from said first plurality of segments as a function of a second segment from said second plurality of segments.

2. The apparatus according to claim 1 wherein said first segment and said second segments are of substantially equal length.

3. The apparatus according to claim 2 wherein said proximity correction to said first segment is not a function of any segments in said second plurality of segments other than said second segment.

4. The apparatus according to claim 3 wherein proximity correction to said second segment is performed as a function of the first segment.

5. The apparatus according to claim 4 wherein the proximity correction performed on said second segment is not a function of any segment of said first plurality of segments other than said first segment.

6. The apparatus according to claim 5 wherein each dividing line in said first plurality of dividing lines is parallel to each other dividing line in said first plurality of dividing lines.

7. The apparatus of claim 6, further comprising:
   d. Means for segmenting a third piece of a mask pattern with a second plurality of dividing lines into a plurality of segments;
   e. means for segmenting a fourth piece of said mask pattern with said second plurality dividing lines into a fourth plurality of segments: and
   f. means for applying proximity correction to a third segment from said third plurality of segments as a function of a fourth segment from said fourth plurality of segments.

8. The apparatus according to claim 7 wherein each dividing line in said second plurality of dividing lines is parallel to each other dividing line in said second plurality of dividing lines.

9. The apparatus according to claim 8 wherein each dividing line in said first plurality of dividing lines is perpendicular to each dividing line in said second plurality of dividing lines.

10. The apparatus according to claim 9 wherein said third segment and said fourth segment are of substantially equal length.

11. The apparatus according to claim 10 wherein, the proximity correction applied to said third segment is a function of said fourth segment.

12. The appartus according to claim 11 wherein proximity correction to said fourth segment is further performed as a function of said third segment.

13. The apparatus according to claim 1 wherein said proximity correction to said first segment is not a function of any segments in said second plurality of segments other than said second segment.

14. The apparatus according to claim 1 wherein proximity correction to said second, segment is performed as a function of the first segment.

15. The apparatus according to claim 14 wherein the proximity correction performed on said second segment is not a function of any segment of said first plurality of segments other than said first segment.

16. The apparatus according to claim 1 wherein each dividing line in said first plurality of dividing lines is parallel to each other dividing line in said first plurality of dividing lines.

17. The apparatus of claim 1, further comprising:
   d. means for segmenting a third piece of a mask pattern with a second plurality of dividing lines into a plurality of segments;
   e. means for segmenting a fourth piece of said mask pattern with said second plurality dividing lines into a fourth plurality of segments; and
   f. means for applying proximity correction to a third segment from said third plurality of segments as a function of a fourth segment from said fourth plurality of segments.

18. The apparatus according to claim 17 wherein each dividing line in said second plurality of dividing lines is parallel to each other dividing line in said second plurality of dividing lines.

19. The apparatus according to claim 18 wherein each dividing line in said first plurality of dividing lines is perpendicular to each dividing line in said second plurality of dividing lines.

20. The apparatus according to claim 17 wherein said third segment and said fourth segment are of substantially equal length.

21. The apparatus according to claim 17 wherein, the proximity correction applied to said third segment is a function of said fourth segment.

22. The apparatus according to claim 21 wherein proximity correction to said fourth segment is further performed as a function of said third segment.

23. The apparatus according to claim 1 wherein at least one of said plurality of dividing lines is derived from a physical structure of said first piece.

24. The apparatus according to claim 23 wherein said physical structure of said first piece is an end point.

25. The apparatus according to claim 1 wherein at least one of said plurality of dividing lines is derived from a physical structure of said second piece.

26. The apparatus according to claim 25 wherein said physical structure of said second piece is an end point.

27. The apparatus of claim 13 further comprising means for segmenting a third piece of a mask pattern with said plurality of dividing lines into a third plurality of segments and wherein said proximity correction to said first segment is as applied as a function of said second segment and a third segment from said third plurality of segments.

28. The apparatus according to claim 27 wherein said first, second and third segments are of substantially equal length.

29. A segmented mask pattern for proximity correction, comprising:
- a first piece of a mask pattern segmented in accordance with a plurality of dividing lines into a first plurality of segments, said first plurality of segments comprising a first segment;
- a second piece of a mask pattern segmented in accordance with a plurality of dividing lines into a second plurality of segments, said second plurality of segments comprising a second segment;
- wherein proximity correction on said first segment is applied as a function of said second segment.

30. The mask pattern of claim 29 wherein said first and second segments are of substantially equal length.

31. The mask pattern according to claim 29 wherein at least one of said plurality of dividing lines is derived from a physical structure of said first piece.

32. The mask pattern according to claim 14 wherein said physical structure of said first piece is an end point.

33. The mask pattern according to claim 29 wherein at least one of said plurality of dividing lines is derived from a physical structure of said first piece.

34. The mask pattern according to claim 29 wherein said plurality of dividing lines are parallel.

35. The mask pattern according to claim 29 wherein the pattern or data representing the pattern is stored on a computer readable media.

* * * * *